United States Patent [19]

Scifres et al.

[11] 4,251,780
[45] Feb. 17, 1981

[54] STRIPE OFFSET GEOMETRY IN INJECTION LASERS TO ACHIEVE TRANSVERSE MODE CONTROL

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 921,530

[22] Filed: Jul. 3, 1978

[51] Int. Cl.³ .............................................. H01S 3/19
[52] U.S. Cl. ................................ 331/94.5 H; 357/18
[58] Field of Search ..................... 331/94.5 H; 357/18

[56] References Cited

FOREIGN PATENT DOCUMENTS 2727793  1/1978  Fed. Rep. of Germany ..... 331/94.5 H
51-100687  9/1976  Japan ................................. 331/94.5 H

OTHER PUBLICATIONS

P. J. DeWaard, "Stripe-Geometry D. H. Lasers with Linear Output/Current Characteristics," *Electronics Letters*, vol. 13, No. 14, pp. 400–401, Jul. 1977.
N. Matsumoto et al., "Semiconductor Lasers with Bent Guide of Planar Structure," *Japan Journal of Applied Physics*, vol. 16, No. 10, 10–1977, pp. 1885–1886.
N. Matsumoto, "The Bent-Guide Structure AlGaAs-GaAs Semiconductor Laser," *IEEE Journal of Quantum Electronics*, vol. QE-13, No. 8, Aug. 1977, pp. 560–564.
B. L. Frescusa et al., "Suppression of Output Nonlinearities in Double-Heterostructure Lasers by Use of Misaligned Mirrors," *Applied Physics Letters*, vol. 31, No. 11, pp. 770–773, Dec. 1970.

*Primary Examiner*—James W. Davie
*Attorney, Agent, or Firm*—W. Douglas Carothers, Jr.

[57]  ABSTRACT

An injection laser of the multilayer planar type, such as, heterostructure GaAs:GaAlAs lasers are provided with offset geometry in the configuration of the stripe on surface of the device to stabilize the propagating optical beam such that the power output versus current pumping characteristic is linear over an extended range of operating currents. Many types of stripe offset geometries are disclosed which contribute in various degrees to such transverse mode stabilization.

22 Claims, 21 Drawing Figures

STRIPE OFFSET GEOMETRY IN INJECTION LASERS TO ACHIEVE TRANSVERSE MODE CONTROL

BACKGROUND OF INVENTION

This invention relates to semiconductor injection lasers and, more particularly to heterostructure GaAs:-GaAlAs lasers adapted for fundamental transverse mode operation.

A major concern in the development of semiconductor injection lasers has been to obtain lowest order transverse mode operation. This is because higher power outputs and improved linear light output versus pumping current input are being sought to meet requirements necessary, for example, for optical fiber transmission, optical disc writing and integrated optical components and circuits.

Heterostructure lasers are generally provided with a linear stripe geometry orthogonal to the cleaved ends of the device. Such linear or aligned stripe geometry may be an oxide stripe, diffused stripe, implanted stripe, substrate stripe or planar stripe. Lasers with geometry of this type experience nonlinearities in their light output for different pulsed operating conditions at power levels of only a few milliwatts. Also relaxation oscillations are observed during pulsed operation in the light output. These nonlinearities and oscillations are not desirable in achieving a high intensity and uniform output suitable for commercial applications.

Very narrow linear and orthogonal stripe configurations, such as, 2 $\mu$m wide, lead to lowest order or fundamental transverse mode control near threshold, but at higher current levels, higher order modes are present even with such narrow stripe configurations.

It is generally thought that these output nonlinearities, often referred to as "kinks", are caused by several factors. First, the gain profile, during pumping, is characteristically bell shaped with maximum gain at its center. However, when several milliwatts of output power is achieved (for example 2 to 4 mW), gain saturation is reached. Residual gain at the tails of the profile approach or exceed that at the center of the profile. As a result, the gain profile changes, often having a double hump appearance and instablization of the transverse mode. In effect, recombination of injection carriers is occurring at a faster rate in the active region of the structure at a position directly below the center of width of the stripe relative to the edge or "wings" of the aligned stripe. Secondly, the fundamental mode, $TE_{00}$, as well as other transverse modes, in particular, the $TE_{01}$, mode, impinging on the facets of the laser couple back into their respective modes. In either case, mode nonstability persists.

OBJECTS OF THE INVENTION

It is the primary object of this invention to enchance fundamental transverse mode operation in an injection laser.

It is another object of this invention to provide for such enchancement by what is hereinafter defined as stripe offset geometry on the planar structure of the laser.

Another object of this invention is the provision of stripe offset geometry that provides for higher output power, elimination of nonlinearities in light output versus current characteristics (current kinks) and elimination of relaxation oscillations under pulsed operating conditions.

SUMMARY OF THE INVENTION

In accordance with the invention, an injection laser of the multilayer planar type, such as, double heterostructure GaAs:Ga AlAs lasers, are provided with a stripe offset geometry which stabilizes the transverse mode. Also, the offset geometry causes coupling of light among two or more modes of operation. Because of the offset geometry, the injected carriers preferentially recombine in the active region of the device across the stripe so as to fix the optical path and prevent the residual gain from destabilizing the mode.

"Offset geometry" means a stripe or substrate channel or other induced waveguide configuration that is nonorthogonal to the cleaved end facets of the laser or a curve or other perturbation at least at one point along the linear length of the configuration. Such configurations have always traditionally linear and orthogonal relative to the cleaved ends of the laser device. In the present invention, these configurations may be at an angle relative to the cleaved ends or may be curved at one point along its edges or may have a step function along its edges or may comprise separate stripe elements adjacent to the active waveguide. In any such case, the configuration is said to be offset in that the geometry causes the higher order modes to reflect back or radiate back into the high gain nonabsorbing waveguiding region of the active layer. The higher order modes cannot propagate because of their increased threshold relative to fundamental transverse mode. It is believed that this stabilization in single mode operation is because the light beam itself, due to the offset geometry, prevents the residual gain at the tails of the gain profile from favoring a shift in the optical beam position. Therefore recombination of carriers does not occur too rapidly at the center of this region, relative to its edges or wings.

The employment of such offset geometry makes possible fundamental transverse mode operation together with higher pulsed output power without exhibiting nonlinearities in the power output versus current characteristics and eliminating relaxation oscillations. These advantageous attributes are obtained with no appreciable increase in laser threshold.

Other objects and attainments togehter with a fuller understanding of the invention will become apparent and appreciated by referring to the following description and claims taken in conjunction with the accompanying drawings.

BRIEF DESCRIPTION OF THE DRAWINGS

IN THE DRAWINGS

Figure 1:
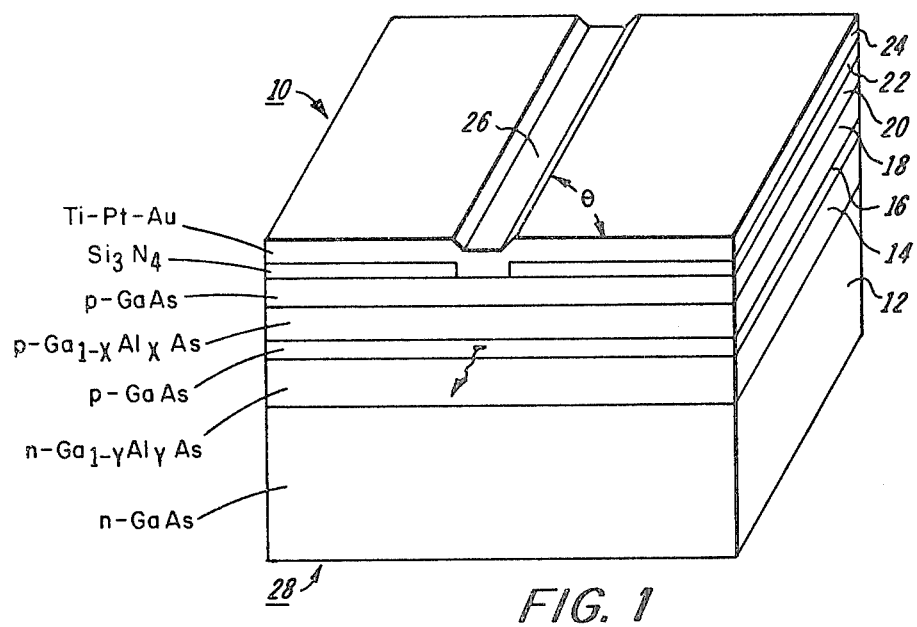

FIG. 1 is a perspective diagrammatic view of an injection laser having stripe offset geometry in the form of an angled stripe at an angle $\theta$ relative to the cleaved ends of the laser.

Figure 2:
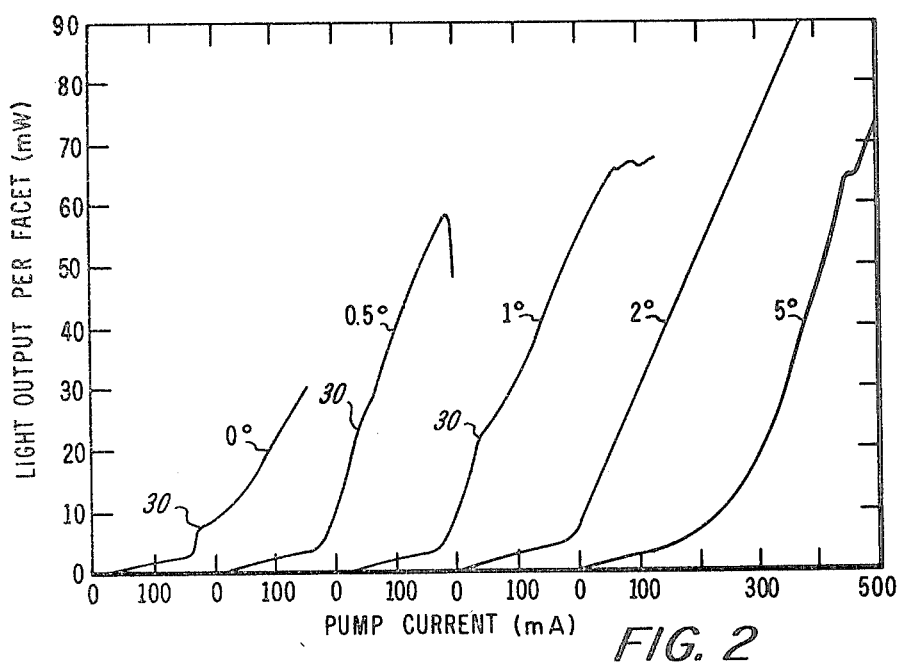

FIG. 2 is a graphic illustration of light output versus pumping current for lasers with different angular stripe geometry.

Figure 3A:
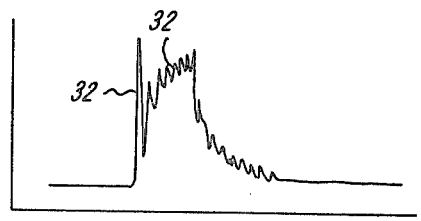
Figure 3B:
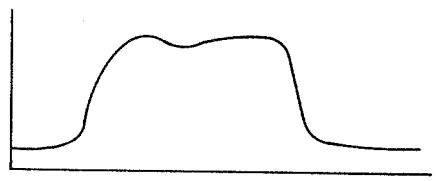

FIG. 3a and 3b are graphic illustrations of pulsed light output for a laser with orthogonal stripe geometry and a laser with angular stripe geometry, respectively.

Figure 4:
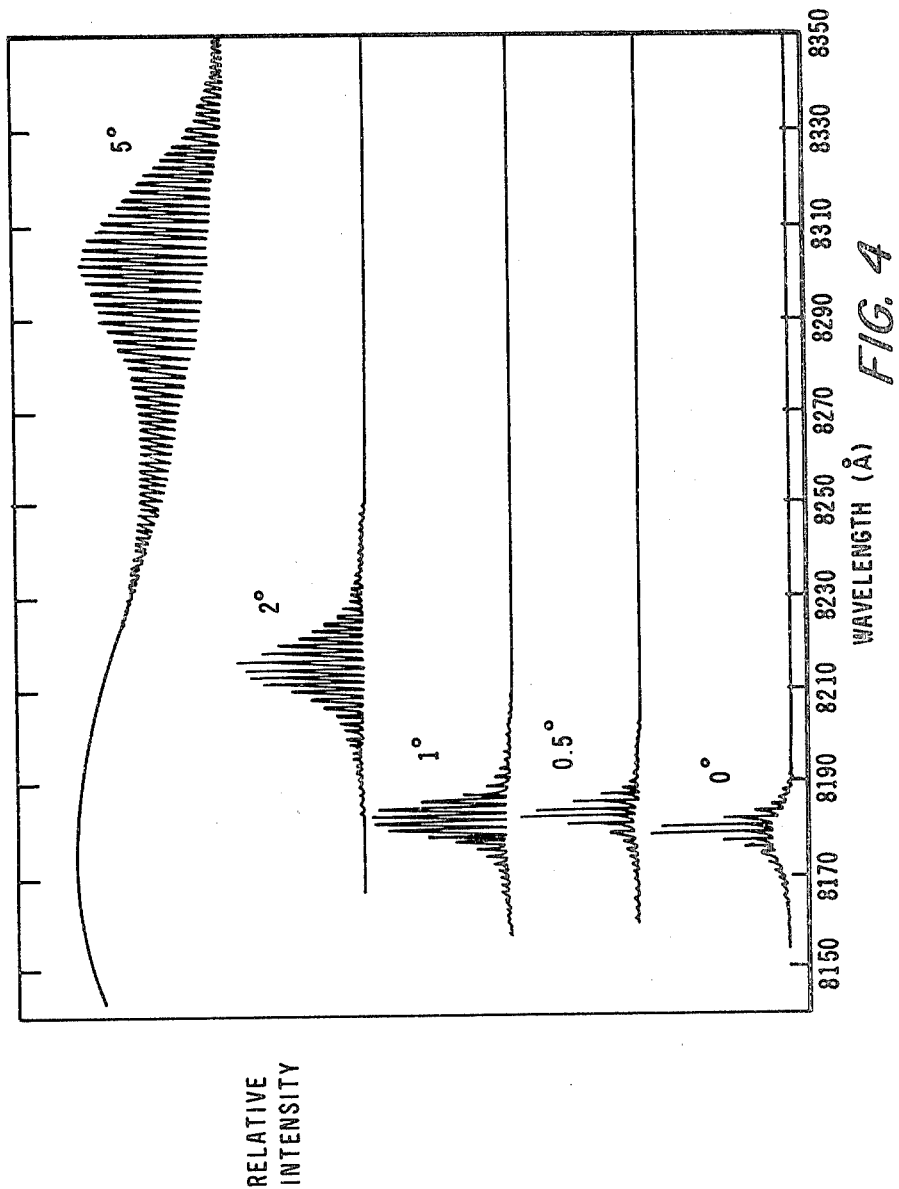

FIG. 4 illustrates the wavelength spectra for lasers with different angular stripe geometry.

Figure 5:
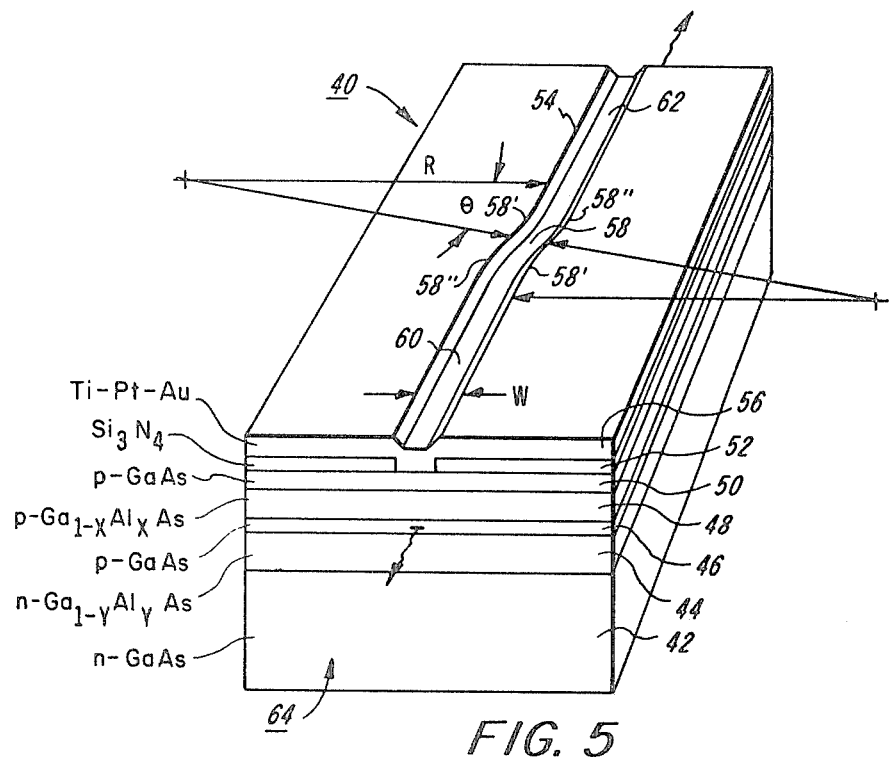

FIG. 5 is a perspective diagrammatic view of an injection laser having offset geometry in the form of a single curve in the stripe geometry.

Figure 6:
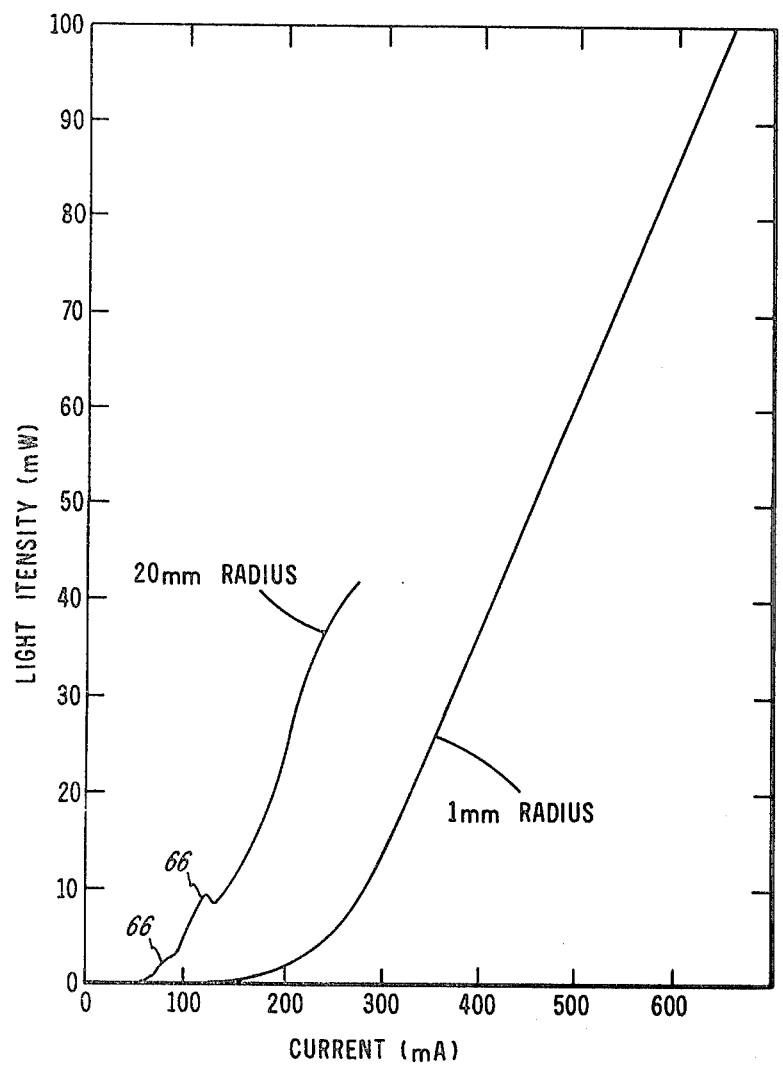

FIG. 6 is a graphic illustration of light output versus pumping current for lasers with curved stripes different radius of curvature.

Figure 7:
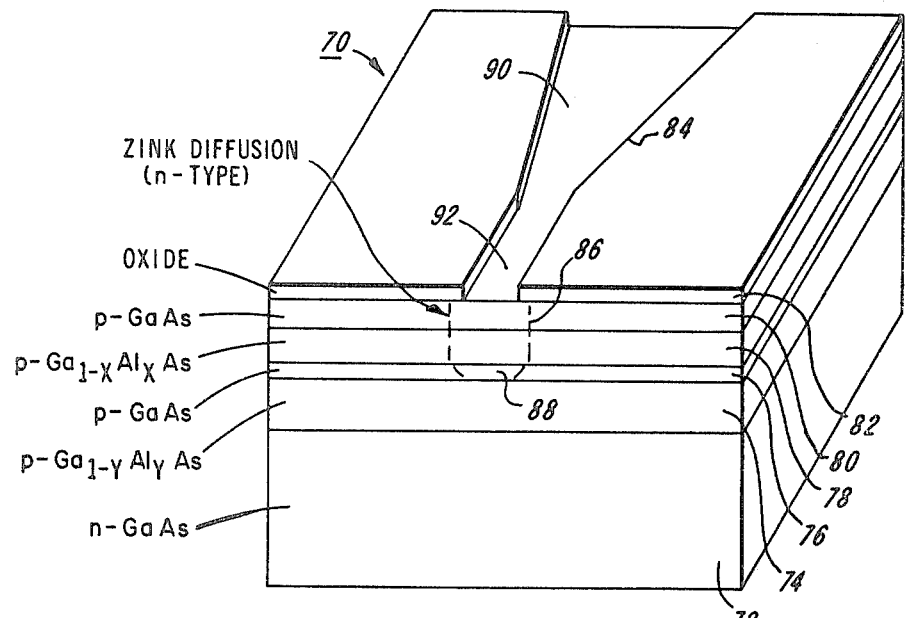

FIG. 7 is a perspective diagrammatic view of an injection laser having offset geometry in the form of horn shape in the stripe geometry.

Figure 8A:
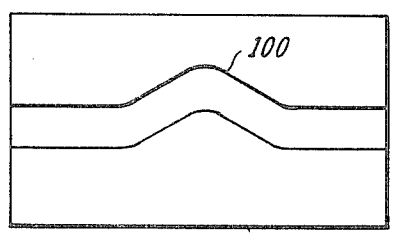
Figure 8B:
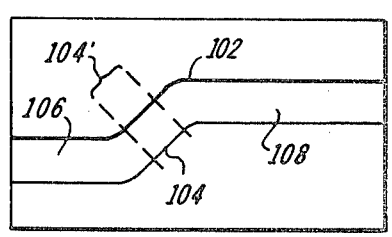
Figure 8C:
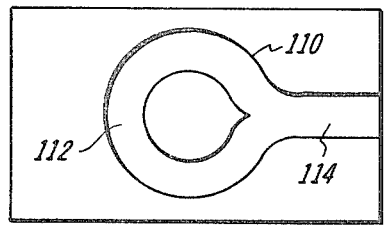
Figure 8D:
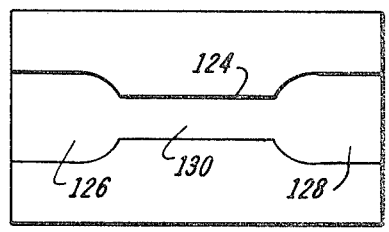
Figure 8E:
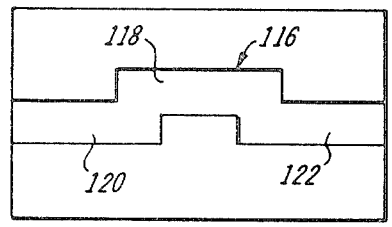
Figure 8F:
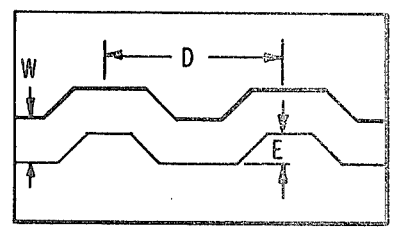
Figure 8G:
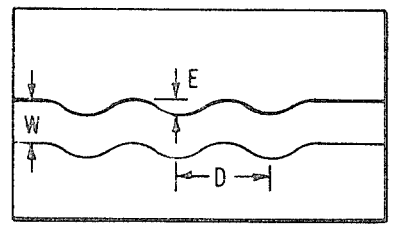
Figure 8H:
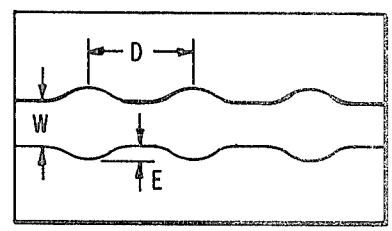
Figure 8J:
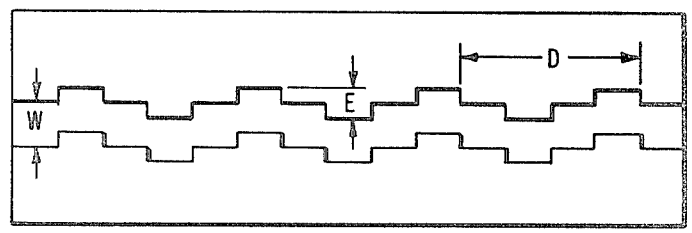
Figure 8I:
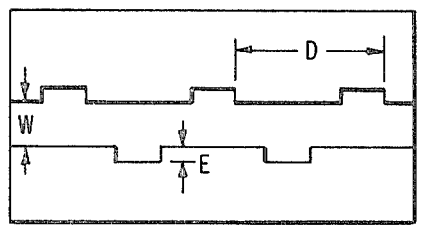
Figure 8K:
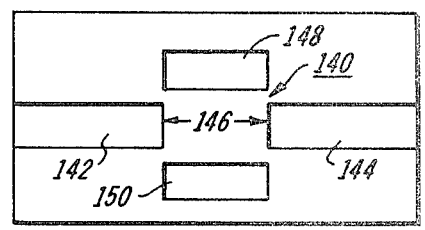

FIGS. 8a and 8k represent various other forms of stripe offset geometry effective in various degrees to obtain fundamental transverse mode operation.

FIG. 8a discloses offset geometry comprising a single arc or arch;

FIG. 8b discloses offset geometry comprising a curve stripe of small radii, R, and positioned closer to one end of the structure;

FIG. 8c discloses offset geometry comprising a circular loop section coupled to a straight section;

FIG. 8d discloses offset geometry comprising two horn shaped sections coupled to a central straight section;

FIG. 8e discloses offset geometry comprising a single step section coupled to two straight and aligned sections;

FIG. 8f discloses offset geometry comprising multiple periodic angular offsets;

FIG. 8g discloses offset geometry comprising a multiple periodic sinusoidal offset;

FIG. 8h discloses offset geometry comprising a multiple periodic offset with curvalinear wider regions;

FIG. 8i discloses offset geometry comprising multiple steps formed along each side of a linear stripe geometry in a periodic but alternate manner;

FIG. 8j discloses offset geometry comprising multiple periodic angular stepped offsets; and FIG. 8k discloses offset geometry comprising two major aligned straight but separate stripe sections with smaller parallel stripe sections adjacent the spacing between the major sections.

Figure 9:
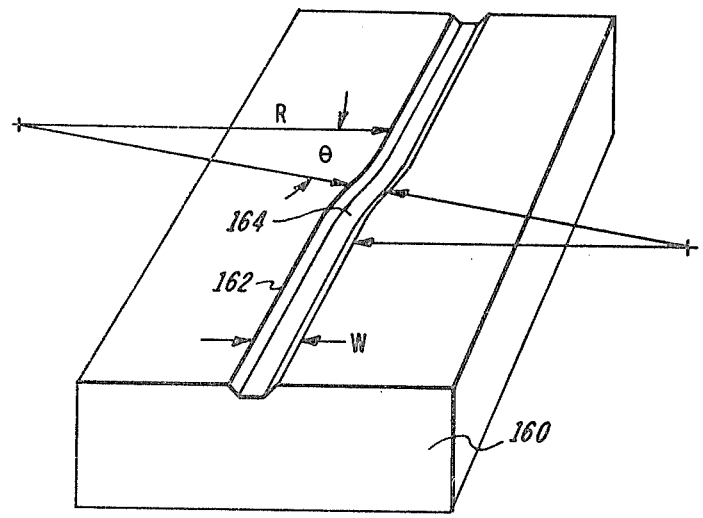

FIG. 9 is a perspective diagrammatic view of a channel substrate prior to growth or deposition techniques.

Figure 10:
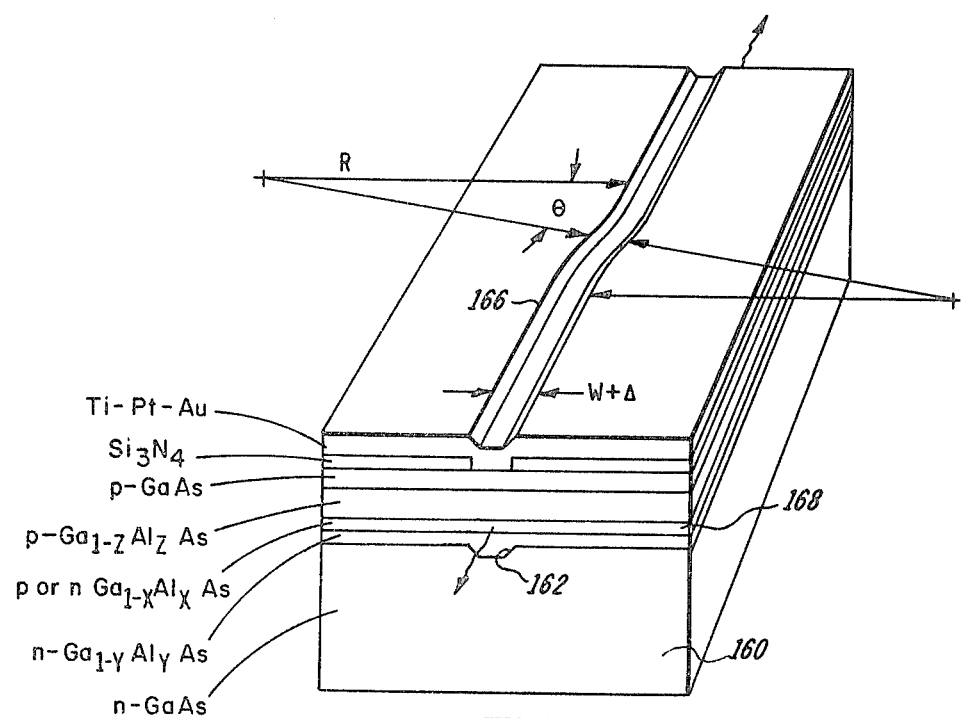

FIG. 10 is a perspective diagrammatic view of an injection laser after application of growth or deposition techniques to the channel substrate of FIG. 9.

DESCRIPTION OF THE PREFERRED EMBODIMENTS

Referring to FIG. 1, there is schematically shown a heterojunction injection laser 10 in accordance with one illustrative embodiment of this invention. The fabrication of laser 10, as well as other laser structures hereinafter described, may be liquid phase epitaxy or molecular beam epitaxy, which techniques are known in the art. The layers 12 (substrate), 14, 16, 18 and 20 may comprise, respectively, n-GaAs, n-Ga$_{1-y}$Al$_y$As, p-GaAs, p-Ga$_{1-x}$Al$_x$-As and p-GaAs where x and y may be the same. For example, layers may each be Ga$_{0.7}$Al$_{0.3}$As of opposite conductivity type. Layers 14 and 18 may be 2 μm thick. The active layer may also be p-GaAlAs where the material constituents provide for the smallest bandgap, for example, Ga$_{0.95}$Al$_{0.05}$As. Layer 20 may be 0.3 μm thick.

As is well recognized in the art, the conductivity type of these layers may be reversed.

Conventional deposition and photolithographic techniques may be employed to provide stripe offset geometry 26 through a prepared opening in the Si$_3$N$_4$ film 22.

The laser 10 may Zn diffused for p side electrical contact, metalized as shown at 24 and cleaved to a desired length, such as, for example, approximately 550 μm.

Although oxide stripe geometry is disclosed here, other different types of stripe geometries may be used to control the fundamental mode pattern taking into consideration desirable adjustment for stripe width and stripe angle $\theta$. Examples of such types are diffused stripe, implanted stripe, substrate stripe or planar stripe.

Also the offset geometry may be provided in the form of a channeled substrate heterostructure laser wherein the channel or groove in the substrate defining the waveguide of the active layer is at an angle or nonorthogonal relative to cleaved ends of the structure or has the channel shape of many of the offset geometries disclosed herein. In this case the current confirming stripe may have the shape of the substrate channel. In addition, any other means for providing a waveguide within the laser may be used.

The stripe offset geometry 26 is positioned at angle $\theta$ relative to cleaved facets 28 of the laser 10. The width of the stripe is typically 8 or 10 μm for good mode controle. However, the range of widths may be from 2 μm to 20 μm. Wider stripe width may be used to obtain higher output powers but higher angle $\theta$ should be employed, such as approximately 5°. As shown in FIG. 2, the angle $\theta$ of the stripe offset geometry 26 for laser 10 is shown for $\theta = 0.5°$, 1° 2° and 5° relative to the plane of cleaved end 28. The plots of output power verses pumping current show the excellent linearity characteristic obtained for offset geometry 26 when $\theta = 2°$, even at high pumping currents. However, where $\theta = 0°$, 0.5° and 1°, a "kink" appears in the curve at 30. The conventional stripe laser with $\theta = 0°$ exhibits a kink 30 at approximately 5 mW. The laser 10 with $\theta$ equal to approximately 2° exhibits no such kinks 30 even at power outputs in excess of 90 mW per facet 28. The kinks 30 where $\theta = 0.5°$ or 1° is less pronounced than compared to the conventional stripe laser.

In FIG. 3a there is shown the pulsed light output of laser 10 where $\theta = 0°$. The output is several milliwatts, for example 3 or 4 milliwatts. To be noted are the relaxation oscillations 32. In FIG. 3b the laser 10 has offset geometry where $\theta = 2°$. However, the light output for laser 10 having this angled geometry is free from such relaxation oscillations. Such oscillations do not appear until very high power levels are reached.

The wavelength spectra for a conventional stripe laser and lasers 10 with offset geometry 26 where $\theta = 0.5°$, 1°, 2° and 5° is shown in FIG. 4. It is to be noted that for increasing angle $\theta$, there is a corresponding increase in the total spectral output width. Also there is a spectra shift to longer wavelengths with increasing $\theta$.

Lasers 10 with angled stripe geometry operate at slightly higher thresholds than conventional lasers employing orthogonal stripe geometry. In applications these minor threshold differences are insignificant.

The following is believed as to how fundamental transverse mode control is achieved. The laser 10 with offset geometry 26, in particular, where $\theta$ equals approximately 2°, the laser does not lase in the waveguide region of the active layer 16 along the exact direction of the angled stripe. The beam is shifted which minimizes threshold even though the beam path passes through lesser pumped regions of the active layer 16. The spectral shift of FIG. 4 correlates with this beam shift. The wavelength shifts toward longer wavelengths to minimize absorption as the beam passes through lesser pumped regions of the active layer.

Since the beam is not confined in the active region to the center of the width of the stripe geometry, the beam itself prevents the residual gain at the wings of the stripe to approach or exceed the gain at the center of stripe by shifting and stimulating the residual injected carriers to recombine.

Also, the $TE_{00}$ (lowest order) mode, upon reflection from the cleaved facet, generates the $TE_{01}$, as well as, other higher order modes. These experience less gain than does the $TE_{00}$ mode, because their lateral extent is greater and they therefore propagate in less highly pumped regions of the crystal. These modes however act to reduce residual gain and the totality of modes because of their mutual coupling or cooperative interrelation can be considered to be a stable "mode" of the offset stripe laser.

The stabilization of the fundamental transverse mode may be achieved with other types of stripe offset geometry. In FIG. 5, the heterojunction injection laser 40 comprises heterostructure layers 42, 44, 46, 48 and 50 and may be of the same structural type as the laser 10 of FIG. 1. For example, n-$Ga_{0.7}Al_{0.3}As$ (Te doped, approximately 2.0 μm thick), p-$Ga_{0.95}Al_{0.05}$-As or p-GaAs (Ge doped, approximately 0.15 μm thick), p-$Ga_{0.7}Al_{0.3}As$ (Ge doped, approximately 1.5 μm thick) and p-GaAs (Ge doped, approximately 0.7 μm thick) are successively grown by liquid phase epitaxy on an n-GaAs substrate. After plasma deposition of a $Si_3N_4$ layer 52 on the p side of the structure, stripe offset geometry 54 is produced by conventional photolithographic and plasma etching techniques. A shallow Zn diffusion is then made followed by a Ti-Pt-Au deposition 56. The cavity length of the structure may be, for example, approximately 500 μm.

Offset geometry 54 comprises a curved section 58 and two straight sections 60 and 62 normal to the cleaved ends 64 and may have a width of 10 μm. However, stripe width plays an important part in this offset geometry. With increasing stripe width, threshold current densities decrease while the output power levels at which kinks occur increases.

In FIG. 6, optical power output per facet versus pumping current is shown for lasers 40 having at the curved section 58, radius of curvatures equal to R=1 mm and φ equal approximately 8.6° and R=20 mm and φ equal approximately 0.43°. In both cases, each arc of curvature 58' is approximately 150 μm in length for a total path length through the curved section approximately 300 μm.

As noted in FIG. 6, laser 40 with R=1 mm exhibits excellent linear optical output versus current characteristics for current levels three times over threshold. Power levels up to 110 mW per facet have been achieved before noticeable kinking. On the other hand, laser 40 with R=20 mm is quite similar to the behavior of conventional lasers with linear, orthogonal stripe geometry. It develops kinks 66 at relatively low power levels such as 3 to 6 mW. Such wide curve geometry has very little effect on mode control over conventional lasers.

As in the case of stripe offset geometry 26 of FIG. 1, offset geometry 54 of FIG. 5 also serves to eliminate relaxation oscillations as illustrated in FIG. 3b.

Improved mode control is believed to be achieved as follows. In the curved section 58 of the waveguide in the active layer 46, the fundamental or $TE_{00}$ mode chooses the lowest threshold path for propagation. Thresholds of any alternate or spatially displaced path are significantly higher than the preferred path because the curvature of section 58 produces radiation losses and beam displacement from the center of the waveguide. It is believed that the center of the fundamental mode experiences a shift toward the outer larger radius side 58" of the arc 58' of the curved waveguide. The fundamental mode path position is, therefore, stabilized by the gain profile and radiation losses in the curved section 58. Higher order modes will have higher radiation losses around the curved section 58 than the fundamental mode.

In the straight sections 60 and 62 of the waveguide in the active layer 46, the mode position is stabilized because the displaced beam in the curved section 58 is not aligned relative to the center of the straight sections 60 and 62. As the beam propagates down either straight section 60 or 62, the beam will move toward the center of the waveguide because this is the lowest threshold path, the beam utilizing the higher gain in this region.

Also, it should be noted that as the light couples into a straight section from the curved section 58, all allowed higher order modes of the straight section are partially excited, as well as, the fundamental mode. The displaced beam emerging from the curved section 58 is believed to excite these higher order modes in these straight sections 60 and 62. This action, as previously indicated, depletes this excess gain at the side extremities of the waveguide in the proximity of lesser pumped or unpumped regions (below the wings of the stripe offset geometry) thereby contributing to the stabilization of the position of the lowest order or $TE_{00}$ mode.

As previously indicated, stripe width increases in this offset geometry provide increased optical power output without kinks. This is believed to occur because the amount of beam displacement relative to the central axis of the curved section 58 increases with increasing stripe width. The higher modes developed in the straight sections 60 and 62 of the waveguide are increasingly excited by a more asymmetric beam emerging from the curved section 58. Thus, the wider stripe width provides for partial excitation of these higher modes contributing to the excess gain depletion previously mentioned. In other words, this higher order mode excitation in the straight sections serves to deplete the excess carries generated at the edges of the waveguide in proximity to the unpumped regions of the active layer adjacent to the guide thereby preventing kinking and leading to greater mode stabilization.

In FIG. 9 there is shown a substrate 160 in which a channel 162 is formed into the substrate prior to crystal growth. In this figure, the shape of the channel 162 is offset by means of a curved section 164. A majority of the other offset configurations shown in the other figures can also be used to define the channel configuration.

After forming the offset channel 162, crystal growth is initiated to form layers such as are shown in FIG. 10. A means for current confinement is also provided in the vicinity of the channel 162. This means may take the form of a current confinement stripe 166 is shown in FIG. 10 to be the same configuration as the substrate channel 162 and has a width W+Δ where Δ may be in a range of 0-10 μm. The current confinement stripe 166 does not, however, need to be exactly the same configuration as the channel 162 as long as the channel is relatively uniformly pumped along its length.

In operation, the edges of the channel 162 are in close enough proximity to the active waveguide layer to provide optical waveguiding in the plane of the p-n junction. Such waveguiding is readily provided if the channel depth is in the range of, for example, 0.5 μm to 3.0 μm. The separation between the active waveguide and the substrate 160 is in the range of 0.1 to 0.6 μm, and the active waveguide layer 168 thickness may be approximately 200 Å to 0.5 μm when the Al content of the layers is conventional (0 < X < 0.3, 0.2 < y,z < 0.8). Thus, the channel 162 serves as an alternate means of providing a waveguide in the plane of the p-n junction and when offset geometry is provided, highly linear power vs current characteristics may be obtained even at high pump current levels.

Although the substrate channel 162 is specifically described here, other means for providing waveguiding in the plane of the p-n junction, such as, varying crystal growth or deposition of other layer thicknesses or their compositions in a similar manner, may be used to provide similar offset waveguide geometries.

A horn shaped structure as stripe offset geometry is shown in FIG. 7 and may be employed to enhance control of the transverse mode. The heterostructure laser 70 is similar to that of the previously described lasers 10 and 40, except that all layers are of p type conductivity. P type layers 74, 76, 78 and 80 are, through epitaxial techniques, sequentially grown or deposited on substrate 72. By diffusion techniques, n type conductivity is provided through the opening 84 of the oxide layer 82. This Zn diffusion penetrates to the active layer 76 to form a diffused region 86 and a p-n junction 88.

The contour opening 84 provides for an diffusion stripe offset geometry characterized by either a horn shaped or trapezoidal section 90 and a straight section 92. By horn shape it is meant that the sides of section 90 have a parabolic shape. By trapezoidal shape it is meant that the sides of section have a linear shape at an angle relative to the cleaved facet. The straight section 92, for example, may be 8 μm wide and 200 μm long and the horn taper length may be 300 μm long, the horn width expanding from 8 μm to 25 μm.

FIGS. 8a to 8k show a multitude of stripe offset geometry within the scope of this invention that are effective in various degrees toward stabilizing transverse mode operation. FIGS. 8a, 8b, 8c and 8e can be considered as derivatives of the stripe offset geometry 54 of FIG. 5 while FIG. 8d can be considered as a derivative of the stripe offset geometry of FIG. 7.

The offset geometry 100 of FIG. 8a is a single curve or arc. The offset geometry 102 of FIG. 8b is very similar to the geometry of FIG. 5 except that there are smaller radii, R, provided for the curved section 104 and its central portion 104 is linear. Also the straight sections 106 and 108 are not of equal lengths.

In FIG. 8c, a circular loop section 112 couples into the straight section 114 of the stripe offset geometry 110. In FIG. 8e, the offset geometry 116 is provided with a single step section 118 between two straight sections 120 and 122.

In FIG. 8d, the stripe offset geometry 124 is provided with two horn shaped sections 126 and 128 coupled to a central straight section 130.

FIGS. 8f through 8j represent stripe offset geometries of the multiple type. Here, a plurality of kinks or offsets are provided along the edges of the stripe geometry through which the current will flow, as in the case of previously described offset geometry, the beam will position itself within the waveguide of the active layer of the laser to be in the lowest loss, highest, gain position. Such spatial positioning is determined by the serpentine nature of the stripe offset geometry. Losses in the active waveguide near the edges thereof are large because of radiation of higher order modes in the regions due to the scalloped edges of the offset geometry. The fundamental or lowest order mode can obtain a stable position in the waveguide while higher order modes will have substantially higher radiation losses and lower gain in these edge regions or will not appear until higher current injection levels are reached. Typical offset geometry parameters are W equal to 2 μm to 20 μm, D equal to 5 μm to 100 μm and E equal 1 μm to 5 μm.

The term, "serpentine", means stripe offset geometry that is formed in a multiple periodic, sinuous or winding manner as depicted in FIGS. 8f–8j.

The stripe offset geometry 140 of FIG. 8k is quite different from any of the previously mentioned geometries but still performs the function of providing depletion of the gain at the edges of the established waveguide in the active layer of the laser even at high pumping levels thereby tending to stablize the position of the lowest order mode. Offset geometry 140 comprises main aligned straight sections 142 and 144 separated by spacing 146, which is a nonpumping region. Adjacent to the area of spacing 146 are smaller straight stripe sections 148 and 150. All sections 142, 144, 148 and 150 are pumped. Light will progate down the straight sections 142 and 144 through the unpumped region represented by spacing 146. Pumping of sections 148 and 150 will serve to deplete the excess carriers at the tails of the propagating beam thereby stabilizing the fundamental mode and preventing current kinking.

In summary, properly designed stripe offset geometry in the configurations disclosed herein provides for gain induced waveguiding in the active layer of heterostructure injection lasers thereby stablizing the transverse mode operation of these devices.

While the invention has been described in conjunction with specific embodiments, it is evident that may alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over an extended range of operating currents characterized in that said offset geometry comprises a trapezoidal section coupled to a straight section.

2. The injection laser of claim 1 wherein said offset geometry comprises two trapezoidal sections coupled by said central straight section.

3. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over an extended range of operating currents characterized in that said offset geometry comprises a circular loop section coupled to a straight section.

4. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over an extended range of operating currents characterized in that said offset geometry includes a plurality of offsets along the length of its configuration.

5. The injection laser of claim 4 wherein the width, W, of said geometry is within a range of 2 $\mu$m to 20 $\mu$m, the outward extent of said multiple offsets, E, being within the range of 1 $\mu$m to 5 $\mu$m and the spatial period along the geometry being within the range of 5 $\mu$m to 100 $\mu$m.

6. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over an extended range of operating currents characterized in that said offset geometry has a continuous periodic serpentine configuration along the full length of said current confining means.

7. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over an extended range of operating currents characterized in that said offset geometry comprises first and second aligned straight sections forming a nonpumped region therebetween, third and fourth straight sections positioned on either side of said unpumped region parallel but adjacent to said first and second straight sections.

8. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over an extended range of operating currents characterized in that said offset geometry comprises a slowly expanding parabolic shaped section coupled to a straight section.

9. An injection laser comprising a multilayer planar structure wherein at least one layer thereof is an active waveguiding layer in the plane of the p-n junction for light wave propagation under lasing conditions between cleaved facets at opposite ends thereof, means to confine the current concentration to a defined region of the active layer to thereby restrict the propagating beam in the active layer to the transverse mode, said current confining means being aligned perpendicular relative to said cleaved facets, a perturbational offset geometry included in the configuration thereof at least at one point along the length thereof with offset sufficient to stabilize the optical beam such that the light power output versus current pumping characteristic is linear over anextended range of operating currents characterized in that said offset geometry comprises a plurality of slowly expanding parabolic shaped sections.

10. An injection laser comprising a multilayer planar structure on a substrate wherein at least one layer is an active waveguiding layer in the plane of the p-n junction for light wave propagation under lasing conditions, means to confine the current concentration to a defined region of the active layer to thereby restrict the propagating beam in the active layer to the transverse mode, a channel in said substrate, said channel characterized by an offset geometry included in the configuration of said channel at least at one point along the length thereof with offset sufficient to stabilize the optical beam such that the power output versus pumping characteristic is linear over an extended range of operating currents.

11. The injection laser of claim 10 wherein said offset geometry is linear and nonorthogonal relative to the ends of said planar structure.

12. The injection laser of claim 10 wherein said offset geometry comprises a curved section coupled at each end by a straight section.

13. The injection laser of claim 12 wherein said curved section has two curved portions having the same radius of curvature.

14. The injection laser of claim 10 wherein said offset geometry comprises a trapezoidal section coupled to a straight section.

15. The injection laser of claim 14 wherein said offset geometry comprises two trapezoidal sections coupled to said central straight section.

16. The injection laser of claim 10 wherein said offset geometry comprises a circular loop section coupled to a straight section.

17. The injection laser of claim 10 wherein said offset geometry includes a plurality of offsets along the length of its configuration.

18. The injection laser of claim 10 wherein said stripe offset geometry has a serpentine configuration.

19. The injection laser of claim 10 wherein said offset geometry comprises a slowly expanding parabolic shaped section coupled to a straight section.

20. The injection laser of claim 10 wherein said offset geometry comprises a plurality of slowly expanding parabolic shaped sections.

21. The injection laser of claim 10 wherein said current confinement means is linear.

22. The injection laser of claim 10 further characterized in that said offset geometry is also included in the configuration of said current confinement means.

* * * * *